United States Patent
Zortea et al.

(10) Patent No.: US 9,866,228 B2
(45) Date of Patent: Jan. 9, 2018

(54) BACKGROUND CALIBRATION OF INTERLEAVE TIMING ERRORS IN TIME-INTERLEAVED ANALOG TO DIGITAL CONVERTERS

(71) Applicant: MULTIPHY LTD., Ness-Ziona (IL)

(72) Inventors: Anthony Eugene Zortea, Pipersville, PA (US); Russell Romano, Allentown, PA (US)

(73) Assignee: MULTIPHY LTD., Ness-Ziona (IL)

( * ) Notice: Subject to any disclaimer, the term of this patent is extended or adjusted under 35 U.S.C. 154(b) by 0 days.

(21) Appl. No.: 15/280,930

(22) Filed: Sep. 29, 2016

(65) Prior Publication Data

US 2017/0093415 A1     Mar. 30, 2017

Related U.S. Application Data

(60) Provisional application No. 62/234,705, filed on Sep. 30, 2015.

(51) Int. Cl.
*H03M 1/10* (2006.01)
*H03M 1/06* (2006.01)
*H03M 1/12* (2006.01)

(52) U.S. Cl.
CPC ....... *H03M 1/1033* (2013.01); *H03M 1/0624* (2013.01); *H03M 1/1215* (2013.01)

(58) Field of Classification Search
CPC .................. H03M 1/0836; H03M 1/0809
USPC .................. 341/118, 120, 155, 122
See application file for complete search history.

(56) References Cited

U.S. PATENT DOCUMENTS

| | | | |
|---|---|---|---|
| 8,643,517 B2 * | 2/2014 | Kidambi ............. | H03M 1/1019 341/118 |
| 8,749,410 B1 * | 6/2014 | Van Der Goes .... | H03M 1/1057 341/118 |
| 8,810,442 B1 * | 8/2014 | Zortea ................ | H03M 1/0809 341/118 |
| 2011/0102228 A1 * | 5/2011 | Anthony ............. | H03M 1/0607 341/155 |
| 2013/0241753 A1 * | 9/2013 | Nozaki ............... | H03M 1/0626 341/118 |

* cited by examiner

*Primary Examiner* — Peguy Jean Pierre
(74) *Attorney, Agent, or Firm* — FisherBroyles, LLP; Robert Kinberg

(57) ABSTRACT

A method for performing background calibration of interleave timing errors in N order Time-Interleaved Analog to Digital Converters (TIADCs), according to which N samples of the input signal are acquired in N different phases and the time-interleave error of each phase is calculated. Then the sign of each of the time-interleave error is extracted and the errors are adjusted by adjusting the timing of erroneous phases. This process is repeated until all the errors are lower than a predefined level.

5 Claims, 4 Drawing Sheets

BACKGROUND CALIBRATION OF INTERLEAVE TIMING ERRORS IN TIME-INTERLEAVED ANALOG TO DIGITAL CONVERTERS

CROSS-REFERENCE TO RELATED APPLICATION

This application claims the benefit of U.S. Provisional Application No. 62/234,705, filed Sep. 30, 2015, the disclosure of which is incorporated herein by reference in its entirety.

FIELD OF THE INVENTION

The present invention relates to the field of Analog to Digital Converters (ADCs). More particularly, the invention relates to a method for correcting timing errors in Time-Interleaved ADCs (TIADCs).

BACKGROUND OF THE INVENTION

An Analog to Digital Converter (ADC) is an electronic circuit used to convert an analog signal to digital. ADCs are widely used in communication systems, where analog data is transferred over a digital channel. The typical operation of an ADC includes receiving a clock signal, sampling an analog signal at an event of the clock (either rising or falling edge or both), and producing a digital representation of the sample.

Due to limitations of electronic components of the ADC, such as capacitor charging time, the rate at which an ADC can efficiently acquire a sample is limited. This presents a problem when the analog signal to be converted is of high frequency, which is a present standard in the industry.

Time Interleaved ADCs (TIADCs) present a solution to the above problem. A TIADC is a set of ADCs, hereafter referred to as sub-ADCs, which are multiplexed and interleaved in time in order to provide a sampling rate higher than that of the sub-ADCs. For a TIDAC consisting a set of N sub-ADCs, each with a sampling rate of $F_{S_{sub}}$, and spaced evenly in time by $$\frac{1}{N * F_{S_{sub}}},$$

the net sample rate of the TIADC is $N*F_{S_{sub}}$.

Due to imperfections in analog and digital circuitry, the sub-ADCs cannot be precisely spaced by $$\frac{1}{N * F_{S_{sub}}},$$

causing errors in the sub-ADCs sampling instants referred to as "interleave timing errors". These errors degrade the Signal to Noise and Distortion Ratio (SNDR) of a TIADC.

In addition, interleave timing errors may vary in a number of manners, such as:
- differences between sub-ADCs;
- differences between TIADCs;
- differences between dies; and
- differences between temperatures, processes, power supply voltages, etc., which appear over time.

Calibration of interleaved timing errors and of the systems which produce them can be performed using a method called "foreground calibration", according to which special test signals are introduced at the data signal input, and are tested for time optimization. This method introduces a period of time at which the TIADC is not resolving true input data signals, which is not acceptable for some applications. In addition foreground calibration introduces slowdown in the final data transmission.

Another existing method for calibrating interleaved timing errors is by using special circuitry, such as Digital to Analog Converters. This solution, however, is expensive in terms of die area and power dissipation.

An alternative method is a onetime calibration (e.g., at power-up) where the calibration scheme does not interfere with the transmission scheme once the latter has begun. This method however is not optimal, since the calibration will degrade over time, which entails SNDR degradation over time, when the errors themselves change over time, due to the fact that temperature or other conditions change.

"Design Considerations for Interleaved ADCs", B. Razavi, IEEE JOURNAL OF SOLID-STATE CIRCUITS, VOL. 48, NO. 8, AUGUST 2013) discloses a method for measuring the interleave timing error for a TIADC consisting two sub-ADCs. This method is not sufficient for TIADCs of higher order, consisting more than two sub-ADCs.

It would be advantageous to calibrate time interleaved errors in high order TIADCs without interfering normal data transmission, while maintaining calibration throughout the entire transmission scheme, using an economical system.

It is therefore an object of the present invention to provide a method for calibrating time interleave errors in high order TIADCs, without interfering data transmission, while maintaining calibration through the entire transmission scheme using an economical system.

Other objects and advantages of this invention will become apparent as the description proceeds.

SUMMARY OF THE INVENTION

The present invention is directed to a method for performing background calibration of interleave timing errors in N order Time-Interleaved Analog to Digital Converters (TIADCs), according to which N samples of the input signal are acquired in N different phases and the time-interleave error of each phase is calculated. Then the sign of each of the time-interleave error is extracted and the errors are adjusted by adjusting the timing of erroneous phases. This process is repeated until all the errors are lower than a predefined level.

Erroneous phases timing adjustment may be done by delaying phases with negative errors that are followed by phases with positive errors or by advancing phases with positive errors that are preceded by phases with negative errors.

In one aspect, an average time-interleave error, which exceeds a predefined correction limit, is corrected by adjusting the timing of all the phases.

DETAILED DESCRIPTION OF THE INVENTION

The present invention introduces a method of background calibration of time interleave errors in high order TIADCs (N≥2) by measuring N interleaved timing error between each two adjacent sub-ADCs, extracting the sign of each error, and adjusting the timing of erroneous sub-ADCs according to their sign.

Measuring of interleaved timing errors can be performed according to the method presented by Razavi, wherein two clock signals with the same frequency and with different phases are used to sample the input signal and to auto-correlate said signal at said sample points. The present invention extends the use of phase differentiated clocks, and utilizes N clock signals, each with the same frequency and with different phases from each other. It is these phases which constitute the time interleaved errors, being responsible for enabling and disabling the various sub-ADCs. As explained in the background, imperfections in analog and digital circuitry cause these phases to be non-ideal. It is therefore a purpose of the present invention to correct these time phase errors.

Eq. 1 shows the error calculation according to Razavi, wherein $sig_{\Phi_n}$ is a sample point of the input signal and $\chi_{corr}$ (a, b) is the cross-correlation of the input, evaluated at sample points a and b.

$$\text{Error} = \chi_{corr}(sig_{\Phi_{n+1}}, sig_{\Phi_n}) - \chi_{corr}(sig_{\Phi_n}, sig_{\Phi_{n-1}}) \quad [\text{Eq. 1}]$$

Once N errors have been calculated, the sign of each error is extracted. A negative error relates to a phase which is earlier than expected, while a positive error relates to a phase which is later than expected. Zero error relates to a phase which is perfectly timed.

Next, the timing of the phases is adjusted. According to an embodiment of the invention, only phases with negative errors that are followed by a phase with a positive error are delayed, i.e. pushed forward, in time, thereby adjusting the phases' timing.

According to another embodiment of the invention, only phases with positive errors that are preceded by a phase with a negative error are advanced, i.e. pushed back, in time, thereby adjusting the phases' timing.

Figure 1:
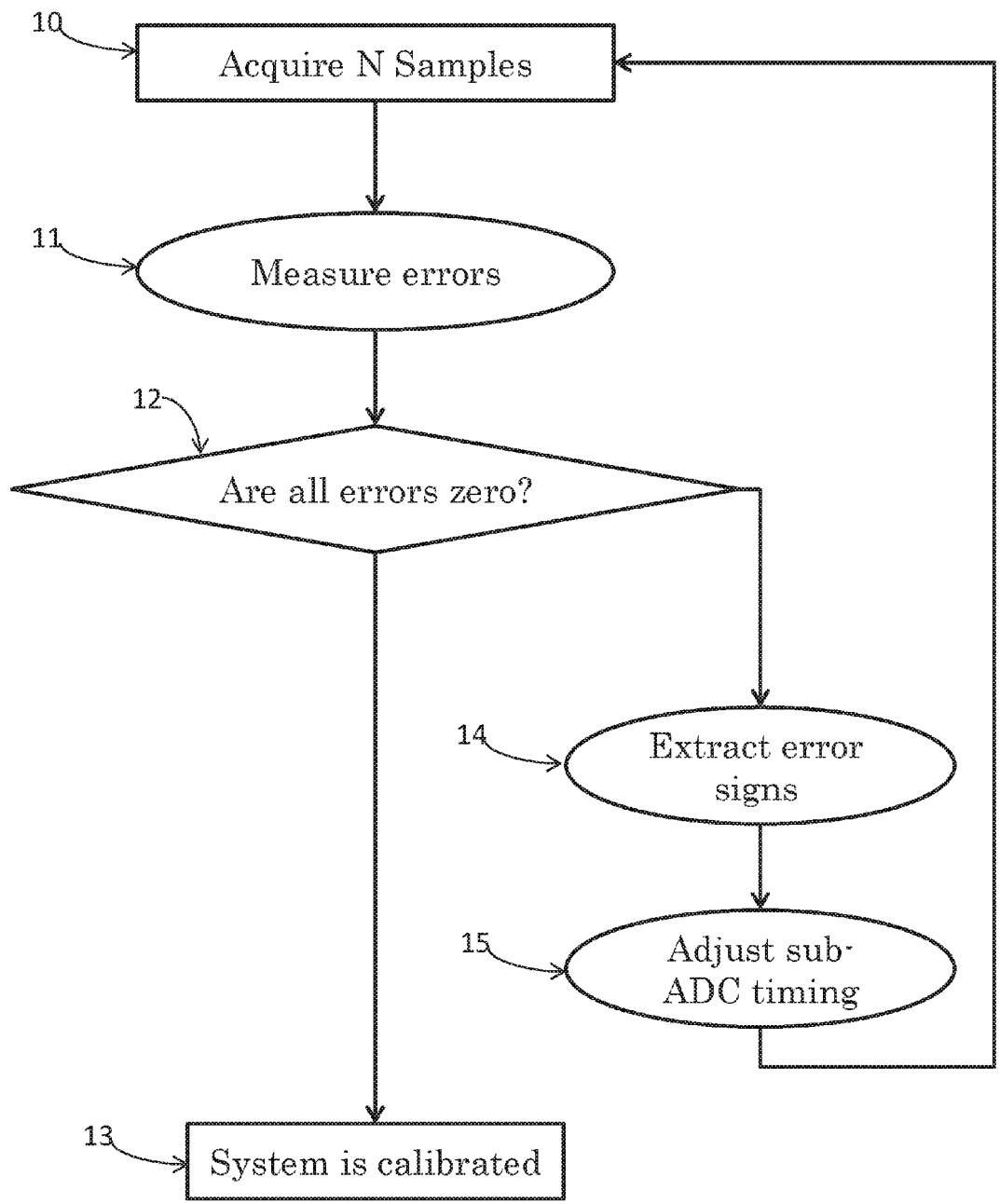
FIG. 1 illustrates a block diagram of the calibration process according to an embodiment of the present invention FIG. 2 schematically illustrates the process of extracting the signs of interleaved timing errors from auto-correlation results, according to an embodiment of the invention FIG. 3 schematically shows the adjustment of erroneous phases, according to an embodiment of the invention.

FIG. 1 illustrates a block diagram of the calibration process according to an embodiment of the present invention. At the first step 10, N samples of the input signal are acquired at N different phases, for the calibration process. These samples are preferably part of the continuous transmission data, allowing the calibration not to interfere data transmission. In the next step 11, the time interleaved errors are measured by calculating the auto-correlation of each two adjacent samples. In the next step 12, a test is performed to determine if all the errors are zero or not. If all the time interleaved errors are zero, then the system is considered to be calibrated, and in step 13 the process ends. If any of the errors are non-zero, in step 14 the signs of the errors are extracted, and in the next step 15 the phases are adjusted according to the process described above.

After adjusting the phases, the calibration process repeats itself, and returns to step 10 where N new samples are acquired. The calibration process will repeat itself as long as there are time interleaved errors that are not zero, i.e. as long as the test result of step 12 is no. Only when all the time interleaved errors are zero will the calibration process end.

In another embodiment of the present invention, step 12 tests the time interleaved errors for being under a predetermined level, rather than being zero.

Figure 2:
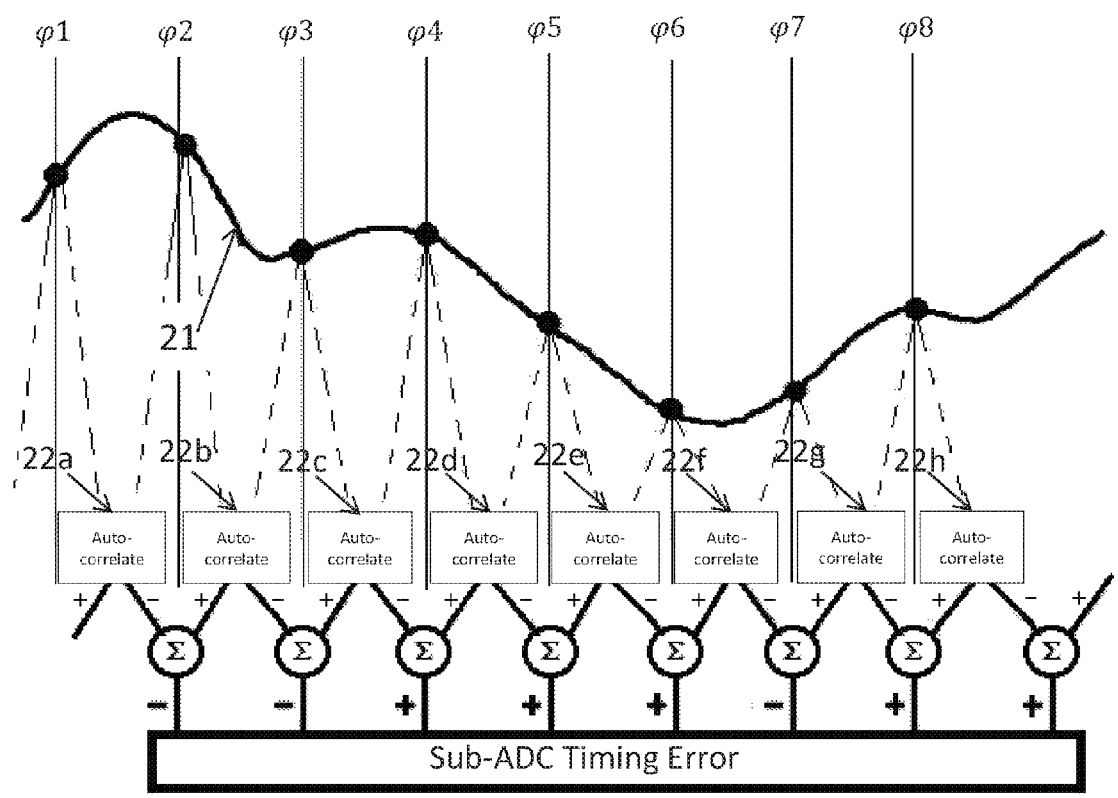

FIG. 2 schematically illustrates a signal 21 which is sampled at eight different phases (Φ1-Φ8). Each two adjacent samples are inserted to a cross-correlation block (22a-22h) which calculates the cross-correlation between the two samples. The signs of the errors, being the difference between the cross-correlations, are schematically shown in FIG. 3 as "−" and "+".

Figure 3:
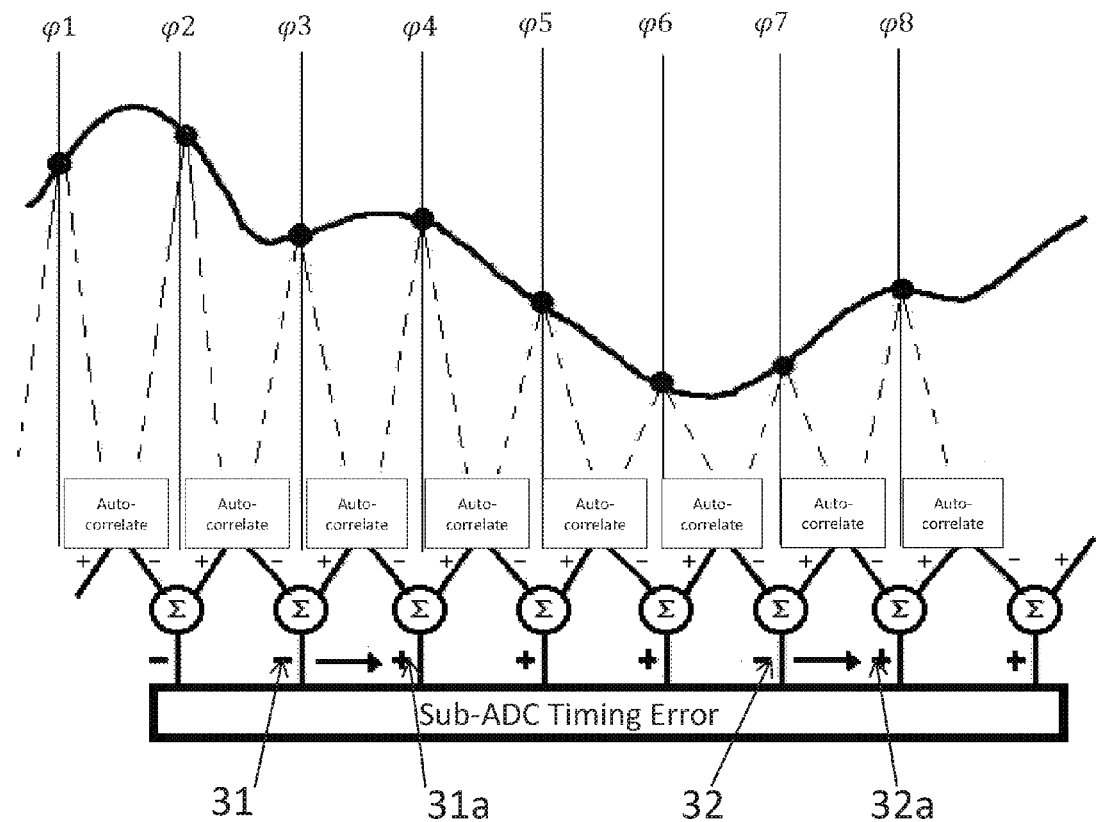

FIG. 3 schematically shows the adjustment of erroneous phases, according to an embodiment of the invention. In FIG. 3, minuses, 31 and 32, are pushed towards pluses, 31a and 32a respectively, indicating phases with negative errors, that are followed by phases with positive errors, are delayed in time.

Figure 4:
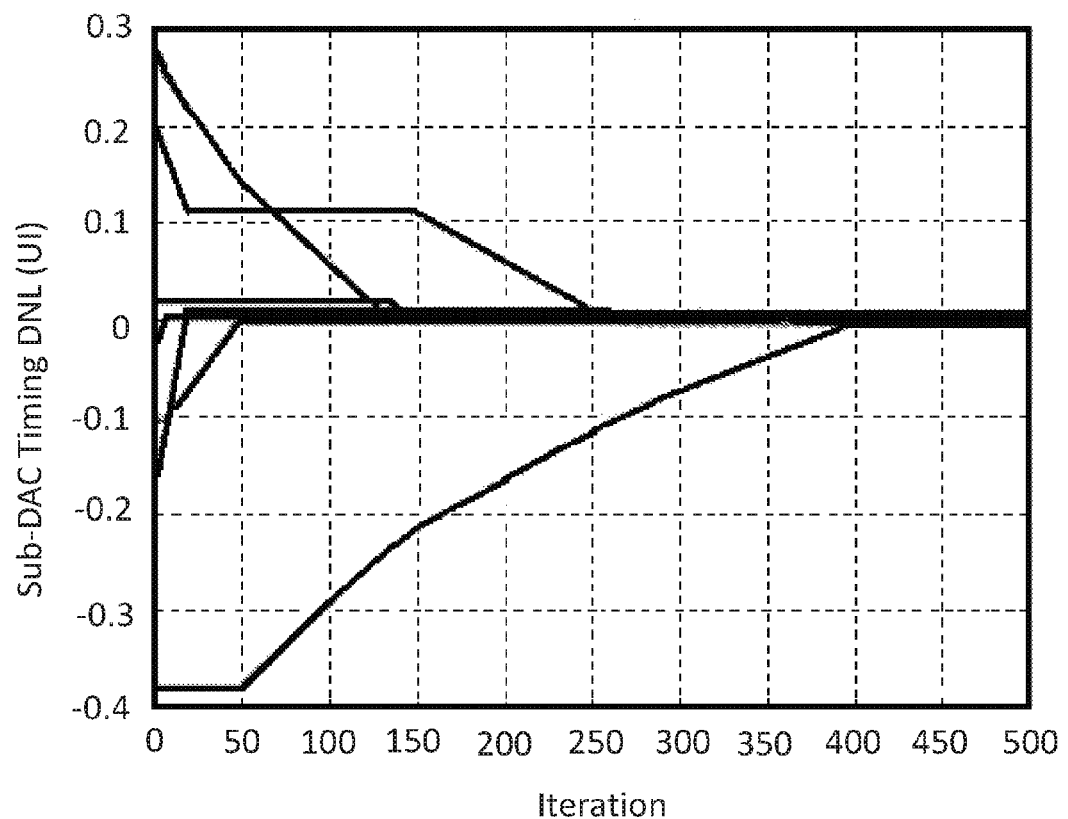
FIG. 4 shows simulation results of the calibration process performed according to an embodiment of the present invention.

FIG. 4 shows the results of a simulation of the calibration process according to an embodiment of the present invention. In FIG. 2, seven timing Differential Nonlinearities (DNLs) of phases, measured in unit intervals, are plotted vs. the number of calibration iterations. It can be seen that within 400 iterations all seven phases are calibrated, and the TIADC is considered calibrated.

In some cases, there is a limit on the size of phase errors that can be corrected. For example, only errors that are within the limits of (−2 ps) and +2 ps can be corrected. In such cases, the average of the phase error corrections is calculated. If the average exceeds the error correction limits, then the average can be changed by adjusting the timing of all the phase corrections. For instance, if the average phase error of 8 phases is +6 ps, and the maximum error correction is +5 ps, each correction can be reduced by +6 ps giving an average correction of 0 ps.

As various embodiments have been described and illustrated, it should be understood that variations will be apparent to one skilled in the art without departing from the principles herein. Accordingly, the invention is not to be limited to the specific embodiments described and illustrated in the drawings.

The invention claimed is:

1. A method for performing background calibration of interleave timing errors in N order Time-Interleaved Analog to Digital Converters (TIADCs), comprising:
    a. acquiring N samples of an input signal in N different phases;
    b. calculating the time-interleave error of each phase, wherein the time-interleave error of a phase is the difference between auto-correlations of the input signal evaluated at both sides of the phase;
    c. extracting a sign of each said time-interleave error;
    d. adjusting the errors of all N difference phases by adjusting the timing of erroneous phases according to said sign; and
    e. repeating steps b) to d) above until all said errors are lower than a predefined level.

2. The method of claim 1, wherein said erroneous phases timing adjustment comprises delaying phases with negative errors that are followed by phases with positive errors.

3. The method of claim 1, wherein said erroneous phases timing adjustment comprises advancing phases with positive errors that are preceded by phases with negative errors.

4. The method of claim 1, wherein an average time-interleave error, which exceeds a predefined correction limit, is measured and corrected by adjusting the timing of all of the phases.

5. A method for performing background calibration of interleave timing errors in N order Time-Interleaved Analog to Digital Converters (TIADCs), comprising:
- a. acquiring N samples of the input signal in N different phases;
- b. calculating the time-interleave error of each phase;
- c. extracting a sign of each said time-interleave error;
- d. adjusting the errors of all N difference phases by adjusting the timing of erroneous phases according to said sign; and
- e. repeating steps b) to d) above until all said errors are lower than a predefined level;
- wherein an average time-interleave error, which exceeds a predefined correction limit, is measured and corrected by adjusting the timing of all of the phases.

\* \* \* \* \*